(12) United States Patent
Kaltalioglu et al.

(10) Patent No.: US 10,304,783 B2
(45) Date of Patent: May 28, 2019

(54) WAFER REINFORCEMENT TO REDUCE WAFER CURVATURE

(71) Applicant: International Business Machines Corporation, Armonk, NY (US)

(72) Inventors: Erdem Kaltalioglu, Newburgh, NY (US); Andrew T. Kim, Poughkeepsie, NY (US); Chengwen Pei, Danbury, CT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 15/707,504

(22) Filed: Sep. 18, 2017

(65) Prior Publication Data

US 2018/0005961 A1 Jan. 4, 2018

Related U.S. Application Data

(62) Division of application No. 14/873,420, filed on Oct. 2, 2015, now Pat. No. 9,852,999.

(51) Int. Cl.
*H01L 23/00* (2006.01)
*H01L 29/06* (2006.01)
(Continued)

(52) U.S. Cl.
CPC .......... *H01L 23/562* (2013.01); *H01L 21/308* (2013.01); *H01L 21/31051* (2013.01);
(Continued)

(58) Field of Classification Search
CPC ................ H01L 23/562; H01L 21/308; H01L 29/66795; H01L 29/0649; H01L 21/76283; H01L 21/31051
See application file for complete search history.

(56) References Cited

U.S. PATENT DOCUMENTS 8,598,035 B2 12/2013 Gruenhagen et al.
2008/0280430 A1 11/2008 Lai et al.
(Continued)

FOREIGN PATENT DOCUMENTS

JP 2008004772 A 1/2008
JP 4380116 B2 12/2009
(Continued)

OTHER PUBLICATIONS

"A new designed trench structure to reduce the wafer warpage in wafer level packaging process" Chunsheng Zhu; Heng Lee; Jiaotuo Ye; Gaowei Xu; Le Luo Electronic Packaging Technology (ICEPT), 2014 15th International Conference on Year: 2014 pp. 606-609, DOI: 10.1109/ICEPT.2014.6922729.
(Continued)

*Primary Examiner* — Jay C Chang
(74) *Attorney, Agent, or Firm* — ZIP Group PLLC

(57) ABSTRACT

A semiconductor structure includes filled dual reinforcing trenches that reduce curvature of the semiconductor structure by stiffening the semiconductor structure. The filled dual reinforcing trenches reduce curvature by acting against transverse loading, axial loading, and/or torsional loading of the semiconductor structure that would otherwise result in semiconductor structure curvature. The filled dual reinforcing trenches may be located in an array throughout the semiconductor structure, in particular locations within the semiconductor structure, or at the perimeter of the semiconductor structure.

7 Claims, 8 Drawing Sheets

(51) Int. Cl.
*H01L 29/66* (2006.01)
*H01L 21/762* (2006.01)
*H01L 21/308* (2006.01)
*H01L 21/3105* (2006.01)

(52) U.S. Cl.
CPC .... *H01L 21/76283* (2013.01); *H01L 29/0649* (2013.01); *H01L 29/66795* (2013.01)

(56) References Cited

U.S. PATENT DOCUMENTS

| | | |
|---|---|---|
| 2009/0085148 A1 | 4/2009 | Ishiguro et al. |
| 2009/0206407 A1 | 8/2009 | Anderson et al. |
| 2010/0258916 A1* | 10/2010 | Cousin .............. H01L 21/02005 257/620 |
| 2012/0007178 A1 | 1/2012 | Oota |
| 2012/0286392 A1 | 11/2012 | Pei et al. |
| 2013/0147007 A1 | 6/2013 | Booth, Jr. et al. |
| 2014/0145191 A1* | 5/2014 | Arnold .................... H01L 22/32 257/48 |
| 2014/0284773 A1 | 9/2014 | Nishiguchi |
| 2015/0069459 A1 | 3/2015 | Takano |
| 2015/0214244 A1* | 7/2015 | Ho ...................... H01L 27/1203 257/506 |

FOREIGN PATENT DOCUMENTS

| | | |
|---|---|---|
| JP | 2010016150 A | 1/2010 |
| KR | 1020030001087 A | 1/2003 |

OTHER PUBLICATIONS

List of IBM Patents or Patent Applications Treated as Related, dated herewith.

\* cited by examiner

US 10,304,783 B2

WAFER REINFORCEMENT TO REDUCE WAFER CURVATURE

FIELD

Embodiments of invention generally relate to the fabrication of semiconductor structures, such as a wafer. More particularly, embodiments relate to reinforcing semiconductor structures to reduce curvature, warping, bowing, etc.

BACKGROUND

A wafer, also referred to as a slice or substrate, is a thin semiconductor material used in electronics for the fabrication of integrated circuits and in photovoltaics for wafer-based solar cells. The wafer serves as the substrate for microelectronic devices built in and over the wafer and undergoes many microfabrication process steps such as doping or ion implantation, etching, deposition of various materials, and photolithographic patterning. Finally individual microcircuits, such as semiconductor chips, are separated and packaged.

There are a number of factors that can affect the shape of a wafer. While a wafer is at full thickness, it typically has the tensile strength to resist any external influences from changing its shape. However, as a wafer is thinned, external influences will cause a wafer to become concave or convex. Some of the more common influences are film type and thickness of the wafer. For example, nitrides can cause a wafer to become concave while oxides can cause a wafer to become convex. Additionally, how heavily a wafer is doped can result in a potato chip shaped wafer. One cause of wafer curvature is a result of stress or strain caused by thermal cycling of the wafer during its fabrication and/or a mismatch of respective Coefficient of Thermal Expansion (CTE) values of the particular film and the wafer material. Generally, the amount of wafer curvature increases as the wafer becomes thinner. Therefore, preventing wafer curvature is particularly important in thin wafer applications.

SUMMARY

In an embodiment of the present invention, a wafer includes a filled deep trench associated with a microdevice formed upon the wafer. The filled deep trench is filled with a trench material. The wafer also includes a filled dual reinforcement trenches separated by dielectric material within the wafer. Each filled dual reinforcement trench is partially filled with the trench material upon the sidewalls of the each of the filled dual reinforcement trenches. The partially filled dual reinforcement trenches are subsequently filled with reinforcing material.

This and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the invention relate to semiconductor structures including filled dual reinforcing trenches that reduce curvature of the semiconductor structure by stiffening the semiconductor structure. The filled dual reinforcing trenches reduce curvature by acting against transverse loading, axial loading, and/or torsional loading of the semiconductor structure that would otherwise result in semiconductor structure curvature.

Embodiments of invention generally relate to semiconductor structures, such as a semiconductor wafer, semiconductor chip, etc. The semiconductor structure may include a layer of substrate material, such as a silicon, gallium arsenide (GaAs), indium phosphide (InP), or other similar materials, utilized in the fabrication of integrated circuits and other microdevices. The wafer typically serves as the substrate for microelectronic devices built in and upon the wafer and undergoes many microfabrication process steps such as doping or ion implantation, etching, deposition of various materials, and photolithographic patterning. The individual microcircuits may be separated into the semiconductor chip.

Referring now to the FIGS. wherein like components are labeled with like numerals, exemplary embodiments that involve a semiconductor device, such as a wafer, chip, integrated circuit, microdevice, etc. in accordance with embodiments of the present invention are shown, and will now be described in greater detail below. It should be noted that while this description may refer to components of the semiconductor device in the singular tense, more than one component may be depicted throughout the figures and within the semiconductor device. The specific number of components depicted in the FIGS. and the cross section orientation was chosen to best illustrate the various embodiments described herein.

Figure 1:
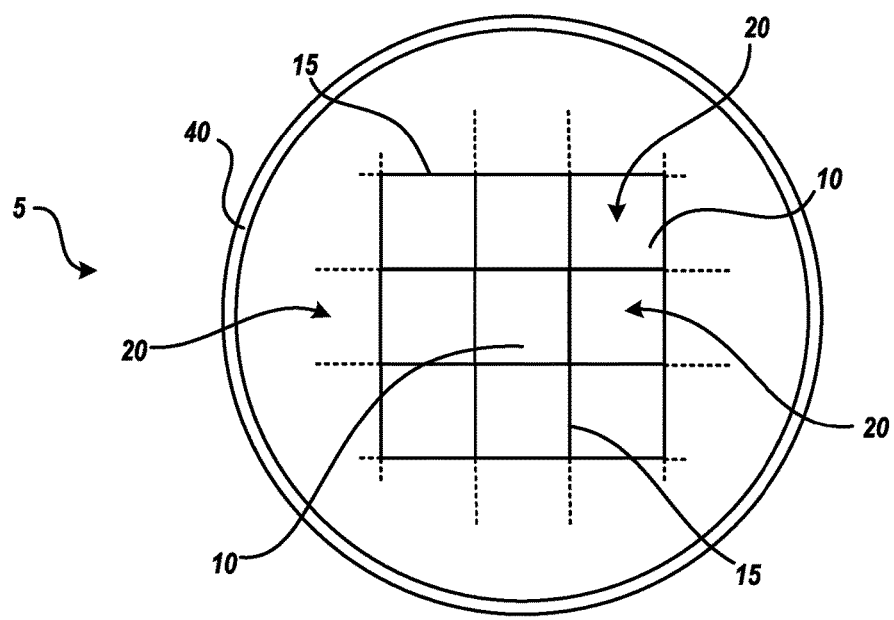
FIG. 1 depicts a semiconductor wafer that may include one or more embodiments of the present invention.

FIG. 1 depicts a semiconductor wafer 5, in accordance with various embodiments of the present invention. Wafer 5 may include a plurality of semiconductor chips 10 separated by kerfs 15. Each chip 10 may include an active region 20 wherein integrated circuit devices, microelectronic devices, etc. may be built using microfabrication process steps such as doping or ion implantation, etching, deposition of various materials, photolithographic patterning, electroplating, etc. Wafer 5 also includes a perimeter region 40 at the edge of wafer 5.

Figure 2:
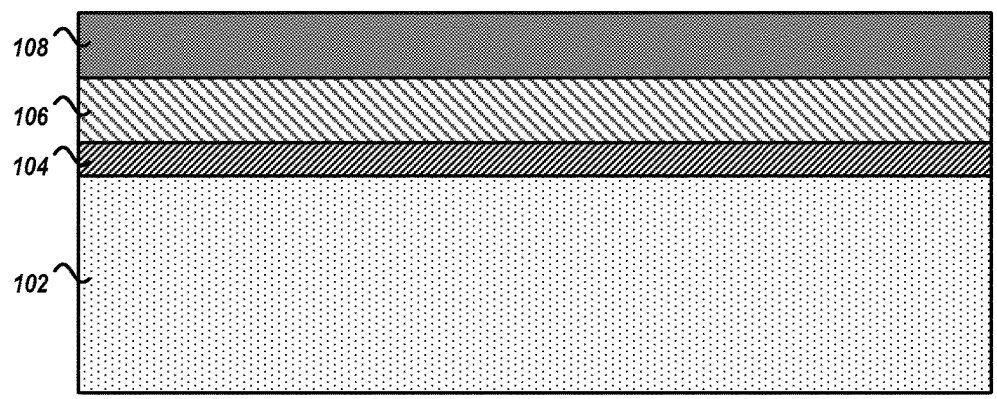
FIG. 2-FIG. 7B depicts cross section views of a semiconductor structure at intermediate stages of fabrication, in accordance with various embodiments of the present invention.

FIG. 2 depicts a cross section view of an exemplary semiconductor structure 100, such as wafer 5, at an intermediate stage of fabrication, in accordance with various embodiments of the present invention. At the present stage of fabrication, semiconductor structure 100 may include a substrate material 102, a buried insulator 104, a semiconductor on insulator (SOI) layer 106, and a mask layer 108. In embodiments, the fabrication stages depicted in FIG. 2-FIG. 7B show one or more portions of a semiconductor chip active region 20.

For clarity, the exemplary semiconductor structure 100 is shown in FIG. 2-FIG. 7B as an SOI device. In other implementations the semiconductor structure 100 may be a bulk device, planar device, etc. the fabrication flow of such devices being generally known in the art. The embodiments of the present invention to fabricate filled dual reinforcing trenches simultaneously with one or more filled deep trenches may be integrated in the fabrication of such bulk or planar devices.

The semiconductor substrate material 102 may include, but is not limited to: any semiconducting material such conventional Si-containing materials, Germanium-containing materials, indium-containing materials and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. Further substrate materials may include, Ge, SiGe, SiC, SiGeC, Ga, GaAs, InAs, InP and all other III/V or II/VI compound semiconductors. Typically the substrate material 102 may be about, but is not limited to, several hundred microns thick. For example, the substrate material 102 may have a thickness ranging from 0.5 mm to about 1.5 mm.

Buried dielectric layer 104 may be formed on top of the substrate material 102, and a SOI layer 106 may be formed on top of the buried dielectric layer 104. The buried dielectric layer 104 may isolate the SOI layer 106 from the base substrate 102. It should be noted that a plurality of fins may be formed by removing portions of the SOI layer 106. To form one or more deep trenches and dual reinforcing trenches, a mask 108 may be formed on top of the SOI layer 106.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material.

Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer 106 may include any of the several semiconductor materials included in the base substrate 102. In general, the base substrate 102 and the SOI layer may include either identical or different semiconducting materials with respect to chemical composition, dopant concentration and crystallographic orientation. In one particular embodiment of the present invention, the substrate 102 and the SOI layer 106 include semiconducting materials that include at least different crystallographic orientations. Typically the substrate 102 or the SOI layer 106 include a {110} crystallographic orientation and the other of the substrate 102 or the SOI layer 106 includes a {100} crystallographic orientation. Typically, the SOI layer 106 may include a thickness ranging from about 5 nm to about 100 nm. In one embodiment, the SOI layer 106 may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that a plurality of fins may be etched from the SOI layer 106. Because the plurality of fins may be etched from the SOI layer, they too may include any of the characteristics listed above for the SOI layer 106.

The mask 108 may be a soft mask or a hard mask and may include any suitable masking material such as, for example, silicon nitride. The mask 108 may be formed using known conventional deposition techniques, for example, low-pressure chemical vapor deposition (LPCVD). In one embodiment, the mask 108 may have a thickness ranging from about 5 nm to about 100 nm. In one embodiment, the mask 108 may be about 50 nm thick.

Figure 3:
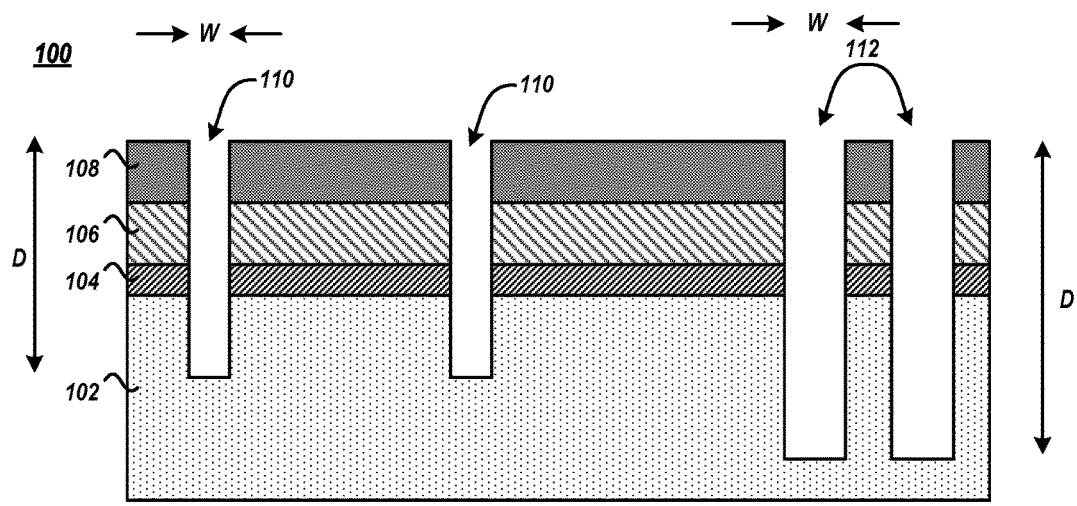

FIG. 3 depicts a cross section view of an exemplary semiconductor structure 100 at an intermediate stage of fabrication, in accordance with various embodiments of the present invention. At the present stage of fabrication, deep trench 110 and dual reinforcing trenches 112 are formed.

The deep trench 110 and dual reinforcing trenches 112 may be simultaneously formed by subtractive removal techniques. For example, deep trench 110 and dual reinforcing trenches 112 may be formed by subtractive etching processes. Such processes may utilize mask 108 to protect underlying material(s) from an etchant utilized to remove material(s) underlying opened portions of mask 108. Portions of the mask 108 may be opened utilizing photolithography; imaging, etching, cleaning, etc. The etchant(s) may be chosen to selectively remove the various materials underlying the opened portions of mask 108. For example, the subtractive removal technique may be a single stage wherein all the materials underlying the opened portion of mask 110 are removed by the same etchant or utilize multiple stages wherein one or more individual materials underlying the opened portion of mask 110 are removed by differing etchants.

The removal of material through mask 108, through SOI layer 106, through buried insulator 104, and partially through substrate 102 forms deep trench 110. Likewise, the removal of material through mask 108, through SOI layer 106, through buried insulator 104, and partially through substrate 102 forms dual reinforcing trenches 112. In some embodiments, the width "W" of deep trench 110 is less than the width "W" of a particular trench of the dual reinforcing trenches 112. In some embodiments, the depth "D" of deep trench 110 is less than the depth "D" of a particular trench of the dual reinforcing trenches 112. In some embodiments, the widths and/or depths of each of the dual reinforcing trenches 112 are similar. The term "same," "similar," or the like, with reference to dimensions, shall be defined herein as alike dimensions within an acceptable fabrication tolerance associated with the dimensioned feature. Unless otherwise indicated, the deep trench 110 and dual reinforcing trenches 112 may be formed by other known processes without deviating from the sprit of those embodiments herein claimed.

Figure 4:
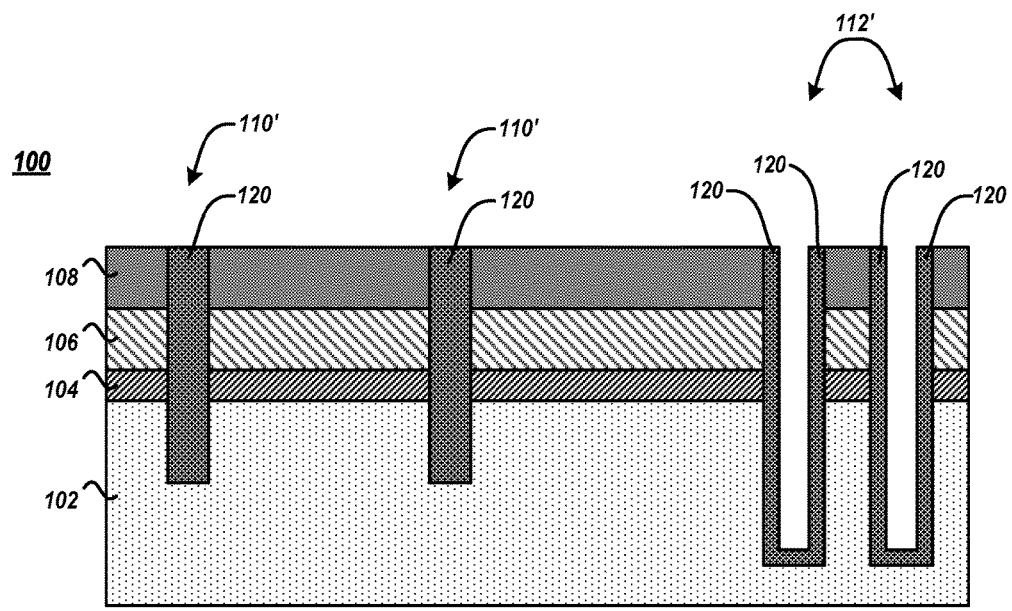

FIG. 4 depicts a cross section view of an exemplary semiconductor structure 100 at an intermediate stage of fabrication, in accordance with various embodiments of the present invention. At the present stage of fabrication, deep trench 110 is filled and dual reinforcing trenches 112 are partially filled.

In an embodiment, the deep trench 110 is filled and dual reinforcing trenches 112 are partially filled by forming a layer of trench material 120 upon mask 108 and within deep trench 110 and dual reinforcing trenches 112. In other embodiments, the deep trench 110 is filled and dual reinforcing trenches 112 are partially filled by selectively forming trench material 120 upon the walls of the deep trench 110 and respective walls of dual reinforcing trenches 112. For example, trench material 120 may be formed upon the sidewall(s) and bottom surface of each respective deep trench 110 and dual reinforcing trenches 112. The thickness of the trench material 120 upon the respective walls of a reinforcing trench 112 may be the same as half the width "W" of deep trench 110.

In various embodiments, trench material 120 may be a dielectric material, such as a doped dielectric material including doped polysilicon, or a conductive material, such as a metal including copper and tungsten. The trench material 120 may be formed by deposition which may include any now known or later developed techniques appropriate for the trench material 120 to be deposited, including, but not limited to: chemical vapor deposition (CVD), liquid plasma CVD (LPCVD), Plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, plating deposition, ion beam deposition, electron beam deposition, laser assisted deposition, thermal oxidation, thermal nitridation, physical vapor deposition (PVD), atomic level deposition (ALD), chemical oxidation, molecular beam epitaxy (MBE), or the like.

The filled deep trench 110 is further recited as filled deep trench 110' and may form a micro device or a portion of a micro device associated with an integrated circuit of the semiconductor chip. For example, the filled deep trench 110 may form a deep trench capacitor, portion of a deep trench capacitor, or the like. Further, the filled deep trench 110' may be included within a deep trench decoupling circuit, an eDRAM circuit, or the like. Another application of filled deep trench 110 includes use as a contact so that a microdevice may contact the substrate 102 below the buried insulator layer 104.

Figure 5:
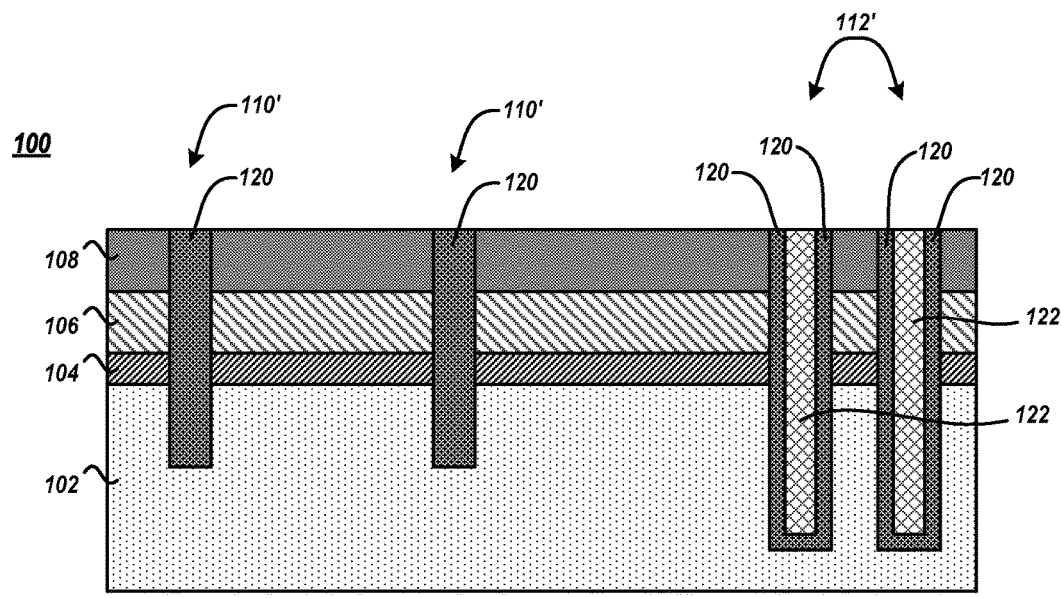

FIG. 5 depicts a cross section view of an exemplary semiconductor structure 100 at an intermediate stage of fabrication, in accordance with various embodiments of the present invention. At the present stage of fabrication, the remaining volumes of the dual reinforcing trenches 112 are filled.

In an embodiment, the remaining volumes of dual reinforcing trenches 112 are filled by forming a layer of reinforcing material 122 upon trench material 120 and within the remaining volumes of dual reinforcing trenches 112. In other embodiments, the remaining volumes of the dual reinforcing trenches 112 are filled by selectively forming reinforcing material 122 upon the inner walls of the remaining dual reinforcing trenches 112. For example, reinforcing material 122 may be formed upon the sidewall(s) and bottom surface of the remaining dual reinforcing trenches 112.

In various embodiments, reinforcing material 122 may be a dielectric material, such as silicon nitride, silicon carbide, etc. or a conductive material, such as a metal, such as tungsten, titanium, etc. In certain embodiments, the reinforcing material 122 and trench material 120 are different materials.

In certain embodiments, a strength measurement associated with the material of reinforcing material 122 is greater than the similar strength measurement of substrate 102. The strength measurement may be modulus, stiffness, hardness, etc. The strength measurement associated with reinforcing material 120 may be either higher, lower, same, etc. than the strength measurement associated with reinforcing material 122. In certain embodiments, the material of reinforcing material 122 has sufficient adhesion strength to adhere to reinforcing material 120 and substrate 102.

The reinforcing material 122 may be formed by deposition which may include any now known or later developed techniques appropriate for the reinforcing material 122 to be deposited, including, but not limited to: CVD, LPCVD, PECVD, SACVD, HDPCVD, RTCVD, UHVCVD, LRP-CVD, MOCVD, sputtering deposition, plating deposition, ion beam deposition, electron beam deposition, laser assisted deposition, thermal oxidation, thermal nitridation, PVD, ALD, chemical oxidation, MBE, or the like.

The fully filled dual reinforcing trenches 112 is further recited as filled dual reinforcing trenches 112' and effectively reduce curvature of the semiconductor structure by stiffen the semiconductor structure 100. For example, the filled dual reinforcing trenches 112' resists tensile, compressive, and/or twisting forces upon or within the semiconductor structure 100 to limit curvature. In embodiments where reinforcing material 122 is electrically conductive, filled dual reinforcing trenches 112' may form a capacitor electrically associated with one or more micro devices of the semiconductor structure 100.

The filled dual reinforcing trenches 112' acts against transverse loading, axial loading, and/or torsional loading of the semiconductor structure 100 to reduce curvature.

Transverse loading is associated with forces applied perpendicular to the longitudinal axis of the semiconductor structure 100. Transverse loading would cause the semiconductor structure 100 to bend and deflect from its original position, with internal tensile and compressive strains accompanying the change in curvature of the semiconductor structure 100. Transverse loading also induces shear forces that cause shear deformation of the semiconductor structure 100 materials and increase the transverse deflection thereof.

Axial loading is associated with forces that are collinear with the longitudinal axis of the semiconductor structure 100. These forces cause the semiconductor structure 100 to either stretch or shorten. Torsional loading is associated with twisting action caused by a pair of externally applied equal and oppositely directed force couples acting on parallel planes of the semiconductor structure 100 or by a single external couple applied to the semiconductor structure 100 that has the proximate portion fixed against rotation.

Figure 6:
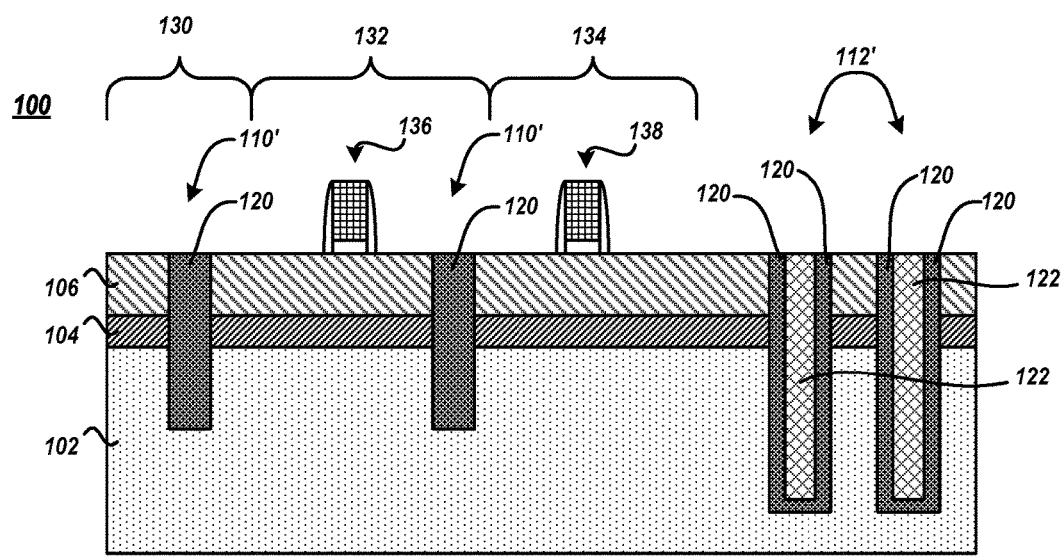

FIG. 6 depicts a cross section view of an exemplary semiconductor structure 100 at an intermediate stage of fabrication, in accordance with various embodiments of the present invention. At the present stage of fabrication, the semiconductor structure 100 is planarized and one or more microdevices 136, 138 are formed.

In embodiments the semiconductor structure 100 may be planarized by a chemical mechanical polish (CMP) technique to remove materials above the top surface of the SOI layer 106. For example, the CMP may remove the mask 108 and portions of the filled deep trench 110' and portions of the filled dual reinforcing trenches 112'.

The semiconductor structure 100 may subsequently undergo further FEOL fabrication stages known in the art to create various microdevices 136, 138. For example, portions of the SOI layer 106 may be removed by a subtractive etching technique to form numerous fins. Micro devices 136, 138 shown as gates may be formed by know gate first or gate last formation techniques. For example, a gate dielectric may be deposited upon the buried insulator 104 and upon and covering the formed fin. Next, a gate material may be deposited upon the gate dielectric and spacers may be formed upon the sidewalls to form FinFET microdevices 136, 138. The fin on extending from the gate serve as the source and drain of the FinFET and the fin beneath the gate serves as the channel of the FinFET as is known in the art.

Though depicted as FinFET microdevices 136, 138, such devices may be other known microdevices formed within or upon the active area of semiconductor structure 100. For example, semiconductor structure 100 may include one or more various microdevice regions 130, 132, and/or 134 adjacent to the filled dual reinforcing trenches 112'. In a first example, a deep trench decoupling circuit region 130 may be directly adjacent to the filled dual reinforcing trenches 112'. In another example, a eDRAM circuit region 132 may be directly adjacent to the filled dual reinforcing trenches 112'. In yet another example, a FinFET circuit region 134 may be directly adjacent to the filled dual reinforcing trenches 112', as is shown in FIG. 6.

Figure 7A:
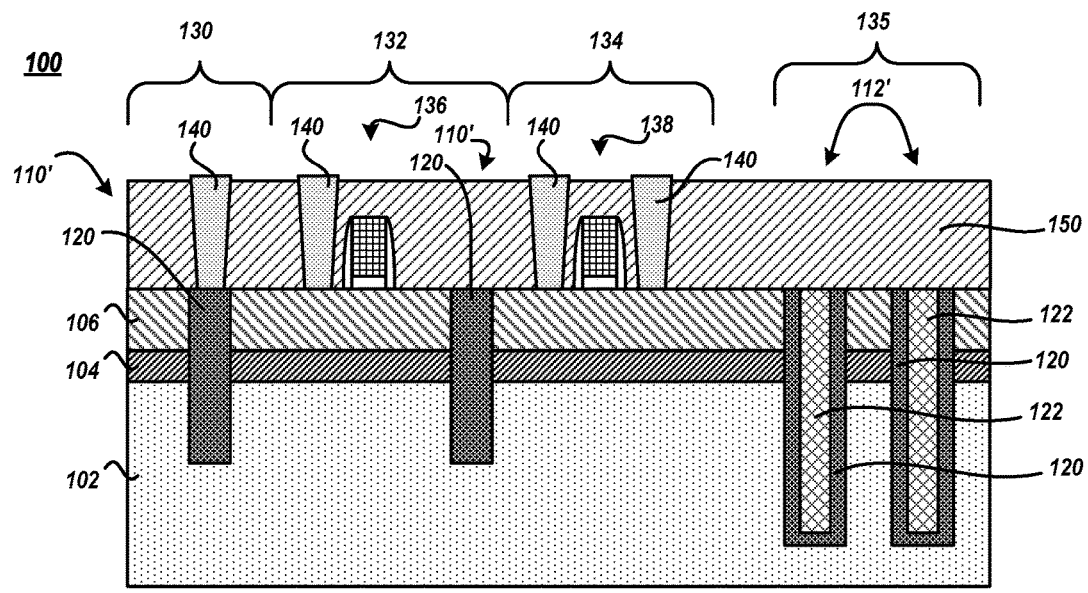

FIG. 7A depicts a cross section view of an exemplary semiconductor structure 100 at an intermediate stage of fabrication, in accordance with various embodiments of the present invention. At the present stage of fabrication, an inter layer dielectric (ILD) 150 is formed upon exposed upper surfaces of semiconductor structure 100 and a contact 140 is formed within the IDL 150 within a microdevice region adjacent to the filled dual reinforcing trenches 112'.

Figure 7B:
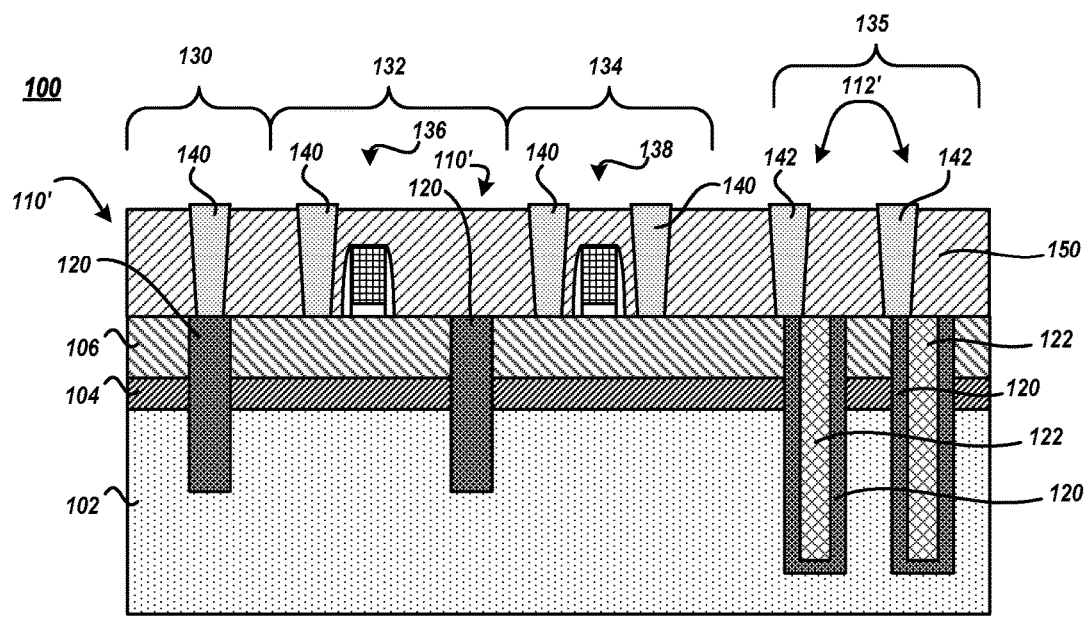

Likewise, FIG. 7B depicts a cross section view of an exemplary semiconductor structure 100 at an intermediate stage of fabrication, in accordance with various embodiments of the present invention. At the alternative stage of fabrication with respect to that shown in FIG. 7B, the ILD 150 is formed upon exposed upper surfaces of semiconductor structure 100, contact 140 is formed within the IDL 150 within a microdevice region adjacent to the filled dual reinforcing trenches 112', and a contact 142 is formed within the IDL 150 upon the at least one of the filled dual reinforcing trenches 112'.

The ILD 150 may be formed upon exposed upper surfaces of semiconductor structure 100 by deposition which may include any now known or later developed techniques appropriate for the ILD 150 to be deposited, including, but not limited to: CVD, LPCVD, PECVD, SACVD, HDPCVD, RTCVD, UHVCVD, LRPCVD, MOCVD, thermal oxidation, thermal nitridation, PVD, ALD, chemical oxidation, MBE, or the like. The ILD 150 may be formed to a thickness sufficient to cover microdevices 136, 138. For example, the ILD 150 may be formed to a thickness sufficient to cover gates of FinFET microdevices 136, 138. In a particular embodiment, ILD may be formed from borophosphosilicate glass (BPSG).

Contact 140 trench(es) and/or contact 142 trench(es) may be simultaneously formed by subtractive removal techniques. For example, the contact trenches may be formed by subtractive etching processes. Such processes may utilize a mask formed upon the ILD 150 to protect the underlying ILD 150 from an etchant utilized to remove the ILD 150 underlying opened portions of the mask. Portions of the mask may be opened utilizing photolithography; imaging, etching, cleaning, etc. The etchant(s) may be chosen to selectively remove the material of ILD 150 underlying the opened portions of the mask while retaining the semiconductor structure 100 material(s) below the ILD 150.

The contact trenches may generally expose underlying semiconductor structure 100 regions. In a first example, in deep trench decoupling circuit region 130 the contact trench exposes filled deep trench 110'. In another example, in eDRAM circuit region 132 the trench exposes source or drain regions of the fin. In yet another example, in FinFET circuit region 134, the trenches expose both the source and drain regions of the fin. Finally, in a reinforcing region 135 containing the filled dual reinforcing trenches 112', the trench(es) expose at least one of the filled dual reinforcing trenches 112'.

Contact(s) 140 and/or contact(s) 142 are formed from electrically conductive material such as a metal. In a particular embodiment, the contact(s) 140 and/or contact(s) 142 are formed from copper. In some embodiments, the contacts 142 together with the filled dual reinforcing trenches 112' may form a Metal-Insulator-Metal (MIM) capacitor. In other words, the semiconductor materials of the substrate 102, the buried insulator 104, and the SOI 106 between the filled dual reinforcing trenches 112' may be the insulating separation to the metal filled dual reinforcing trenches 112'.

For clarity, the exemplary semiconductor structures 100 shown in FIG. 7A and FIG. 7B may be intermediary structures 100 and may undergo additional or further fabrication stages, such as additional FEOL fabrication stages, additional MEOL fabrication stages, subsequent BEOL fabrication stages, and/or chip 10 dicing and packaging fabrication stages, or the like.

Figure 8:
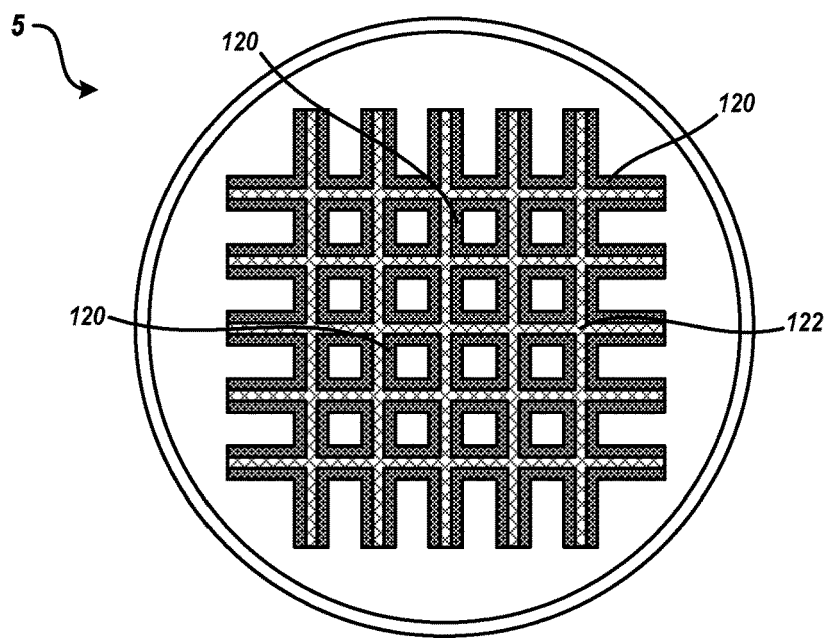
FIG. 8 depicts a top view of a semiconductor wafer including an exemplary global reinforcement array, in accordance with various embodiments of the present invention.

FIG. 8 depicts a top view of an semiconductor wafer 100 including an exemplary global reinforcement array, in accordance with various embodiments of the present invention. A global reinforcement array is generally a pattern of filled reinforcing trenches 112' located throughout the wafer 5. Though shown in FIG. 8 as a polygonal shaped array, the global reinforcement array may be other shapes to form a pattern of filled dual reinforcing trenches 112' located throughout the wafer 5. In a particular embodiment, an array of filled reinforcing trenches 112' may be located at the perimeter of active regions 20, shown in FIG. 1, In other words, the array of filled dual reinforcing trenches 112' may be located within the kerf 15, separating each semiconductor chip 10, shown in FIG. 1.

Figure 9:
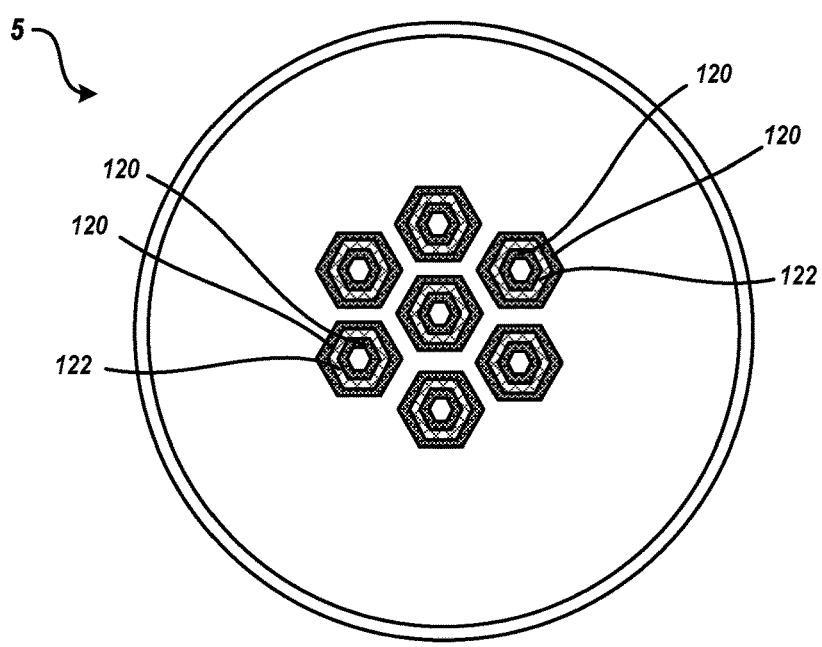
FIG. 9 depicts a top view of a semiconductor wafer including an exemplary local reinforcement array, in accordance with various embodiments of the present invention.

FIG. 9 depicts a top view of a semiconductor wafer including an exemplary local reinforcement array, in accordance with various embodiments of the present invention. A local reinforcement array is generally a discrete pattern of filled reinforcing trenches 112' located in specific locations within the wafer 5. For example, the local reinforcement array may be placed in various noncontiguous perimeter locations of wafer 5 within region 40, shown in FIG. 1. In another example, the local reinforcement array may be placed in kerf 15 regions 15, shown in FIG. 1. In yet another example, the local reinforcement array may be placed in one or more locations within active regions 20, shown in FIG. 1. In other words, the local reinforcement array may generally be placed in areas wafer 5 where there is excess space to form the filled dual reinforcing trenches 112'.

Figure 10:
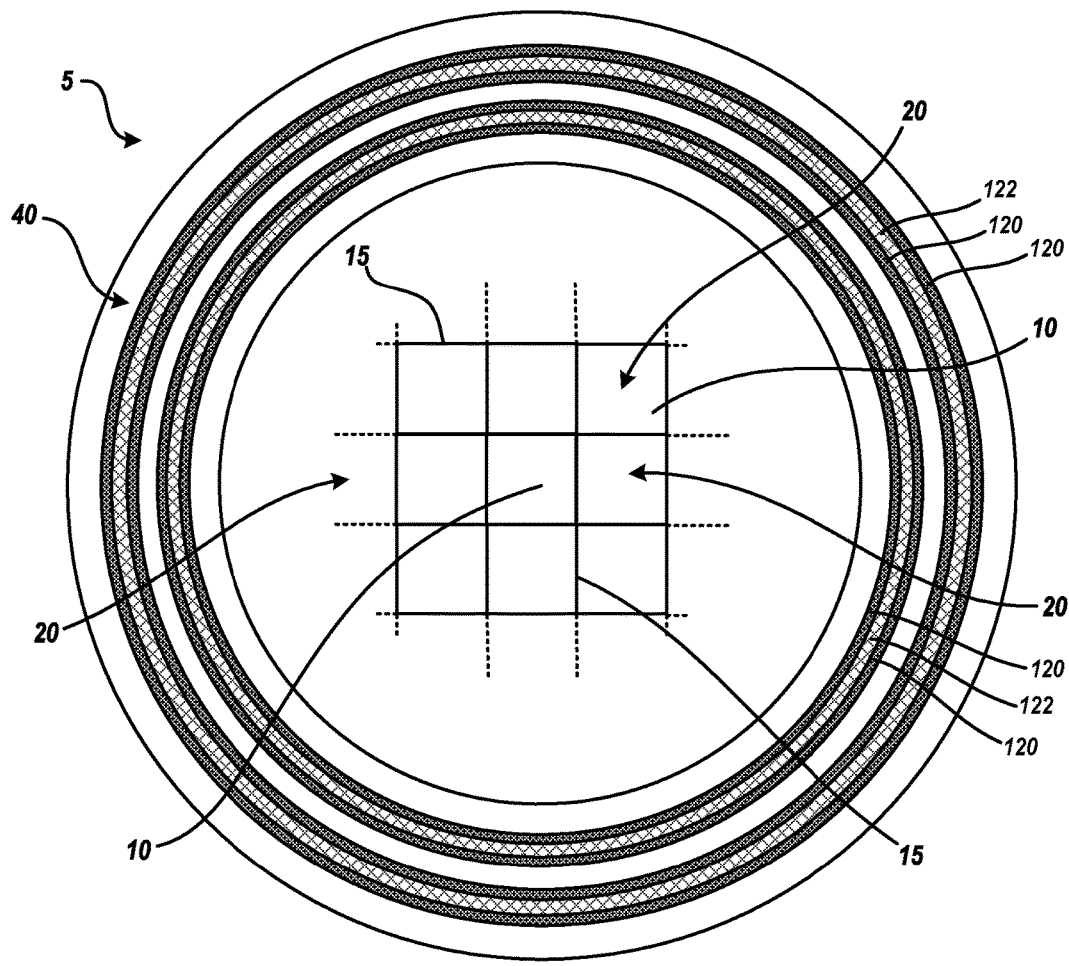
FIG. 10 depicts a top view of a semiconductor wafer including an exemplary perimeter reinforcement array, in accordance with various embodiments of the present invention.

FIG. 10 depicts a top view of a semiconductor wafer including an exemplary perimeter reinforcement array, in accordance with various embodiments of the present invention. A perimeter reinforcement array is generally a pattern of filled reinforcing trenches 112' located within the perimeter region 40 of wafer 5. In an embodiment, the filled dual reinforcing trenches 112' within the perimeter reinforcement array may be a single contagious shape, as is shown in FIG. 10. In another embodiment, the filled dual reinforcing trenches 112' within the perimeter reinforcement array may be in discrete shapes, similar to a local reinforcement array.

Figure 11:
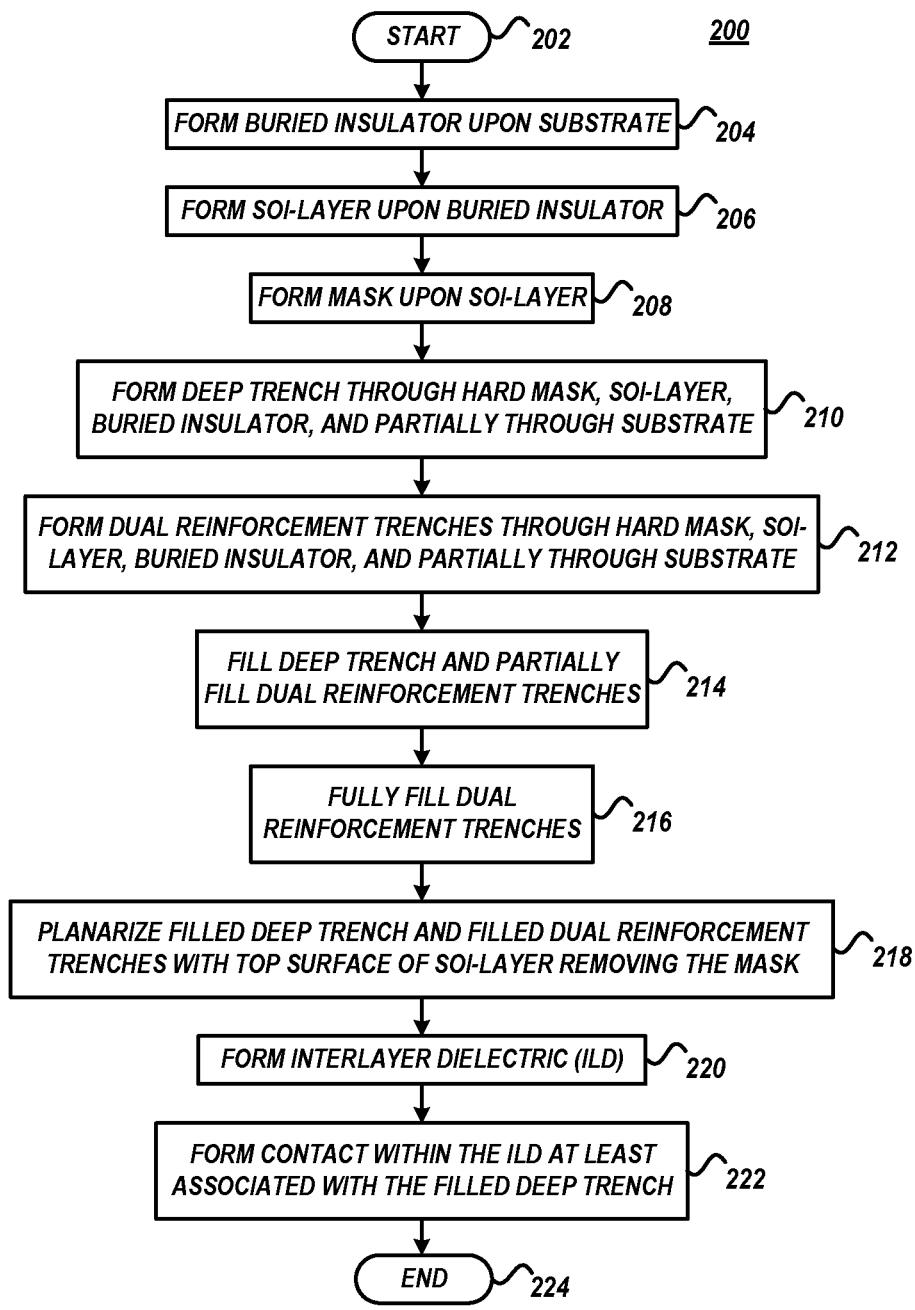
FIG. 11-FIG. 12 depict semiconductor structure fabrication flow methods, in accordance with various embodiments of the present invention.

FIG. 11 depicts an exemplary semiconductor structure fabrication method 200, in accordance with various embodiments of the present invention. Method 200 may be utilized to fabricate a semiconductor structure 100, such as a wafer 5, semiconductor chip 10, etc. Method 200 begins at block 202 and continues with forming a buried insulator 104 upon a substrate 102 (block 204). For example, the buried insulator 104 may be deposited directly upon the substrate 102.

Method 200 may continue with forming an SOI layer 106 upon the buried insulator 104 (block 206). For example, the SOI layer 106 may be deposited directly upon the buried insulator 104.

Method 200 may continue with forming mask 108 upon the SOI layer 106 (block 208). For example, a hard mask 108 or soft mask 108 may be deposited upon the SOI layer 106.

Method 200 may continue with forming a deep trench 110 extending through mask 108, through SOI layer 106, through buried insulator 104, and extending partially through substrate 102 (block 210). Method 200 may continue with forming a dual reinforcement trenches 112 extending through mask 108, through SOI layer 106, through buried insulator 104, and extending partially through substrate 102 (block 212). In certain embodiments, block 210 and block 212 may be formed simultaneously. The trenches may be formed by opening the mask 108 by e.g., photoligraphy techniques. The opened portions of the mask 108 define areas of semiconductor structure 100 where a deep trench 110 and areas where dual reinforcing trenches 112 shall be formed. An enchant may then remove portions of SOI layer 106, buried insulator 104, and substrate 102 underlying the opened mask 108. Exposure to the enchant may be timed such that only portions of substrate 102 are removed to form deep trench 110 and dual reinforcing trenches 112 that do not extend through the substrate 102. In embodiments, the width and depth of each of the dual reinforcing trenches 112 are greater than the width and depth of the deep trench 110.

Method 200 may continue with filling the deep trench 110 forming filled deep trench 110' and partially filling each of the dual reinforcing trenches 112 (block 214). For example, trench material 120 may be deposited within the deep trench 110 filling the deep trench 110 and may be deposited upon the inner walls (e.g., sidewall(s) and bottom wall of dual reinforcing trenches 112, etc.) of the of each of the dual reinforcing trenches 112.

Method 200 may continue with subsequently filling each of the dual reinforcing trenches 112 forming filled dual reinforcing trenches 112' (block 216). For example, reinforcing material 122 may be deposited within each of the remaining dual reinforcing trenches 112 filling each of the remaining dual reinforcing trenches 112. The reinforcing material 122 and may be deposited upon the inner walls (e.g., sidewall(s) and/or bottom wall of each of the remaining dual reinforcing trenches 112, etc.) of each of the remaining dual reinforcing trenches 112. The filled dual reinforcing trenches 112' reduce curvature of the semiconductor structure 100 by stiffening the semiconductor structure 100. For example, the filled dual reinforcing trenches 112' resist tensile, compressive, and/or twisting forces upon or within the semiconductor structure 100 to limit curvature thereof.

Method 200 may continue with planarizing the filled deep trench 110' and the filled dual reinforcing trenches 112' with the top surface of the SOI layer 106 (block 218). For example, a CMP technique may be applied to semiconductor structure may to remove portions of the mask 108, the filled deep trench 110', and the filled dual reinforcing trenches 112' such that the top surface of the filled deep trench 110' and the filled dual reinforcing trenches 112' are coplanar with the top surface of the SOI layer 106. In certain embodiments, semiconductor structure 100 may undergo additional FEOL fabrication stages to form one or more microdevices 136, 138.

Method 200 may continue with forming an ILD 150 upon the at least one of the planrized surfaces (block 220). For example, the ILD 150 may be deposited at least upon the SOI material (e.g., SOI layer 150, fin formed from the SOI layer 150, etc.).

Method 200 may continue with forming a contact within the ILD 150 at least associated with the filled deep trench 110' (block 222). For example, a mask may be applied upon the ILD 150. The ILD 150 may be patterned or opened to define areas of the ILD 150 where which one or more contacts 140 are located. An electrically conductive material may be deposited or otherwise formed within the openings of the ILD 150 to form contact 140. The contact 140 is associated with at least the filled deep trench 110'. For example, the contact 140 may be electrically connected with and contacting the filled deep trench 110' to form a deep trench decoupling circuit within deep trench decoupling region 130 of structure 100. In another example, the filled deep trench 110' may be associated with an eDRAM circuit within eDRAM region 132 of structure 100. In certain embodiments, one or more contacts 142 are simultaneously formed. Contact(s) 142 electrically connect to one or more of the filled dual reinforcing trenches forming a MIM capacitor. Method 200 ends at block 224.

Figure 12:
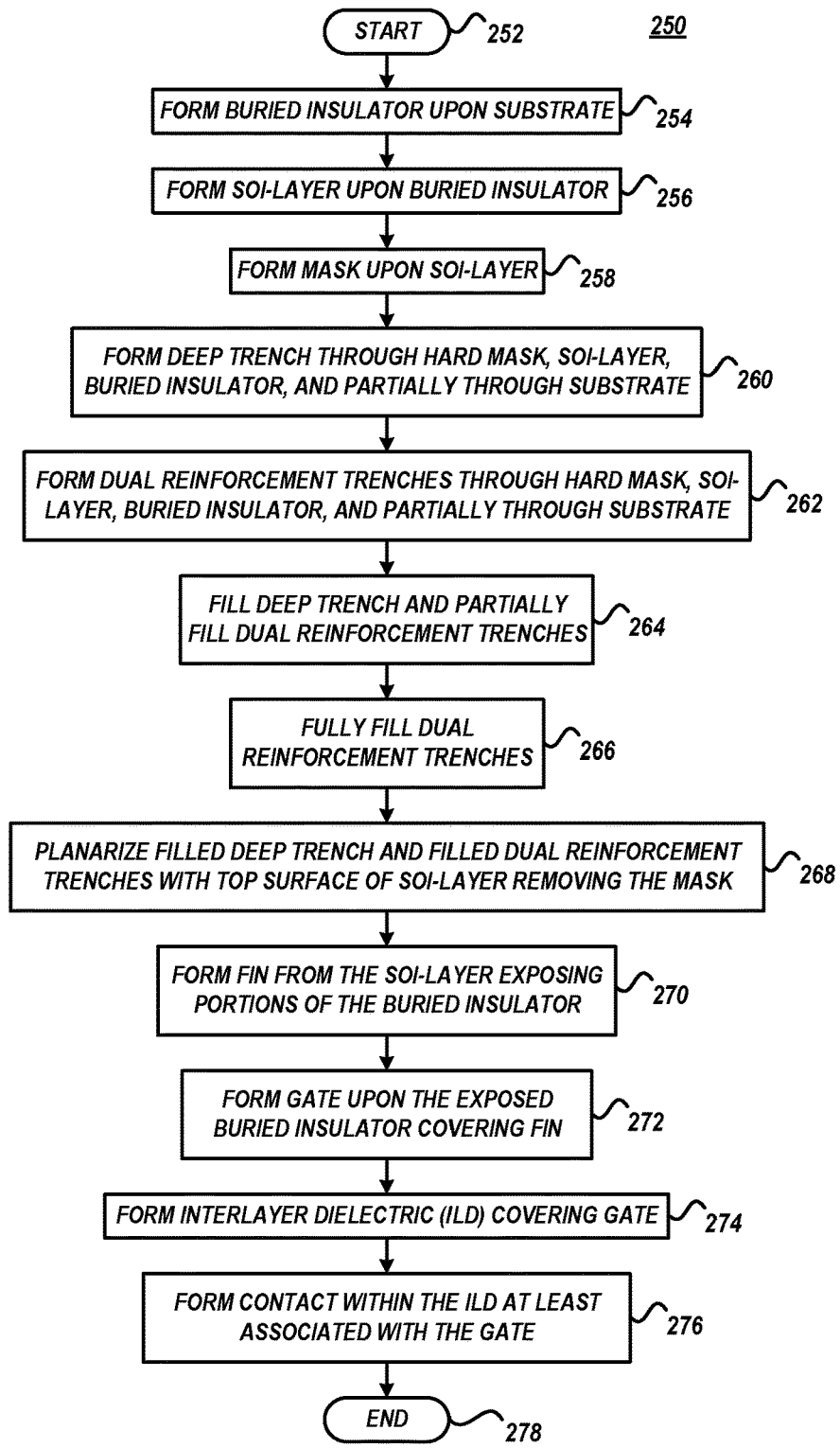

FIG. 12 depicts an exemplary semiconductor structure fabrication method 250, in accordance with various embodiments of the present invention. Method 250 may be utilized to fabricate a semiconductor structure 100, such as a wafer 5, semiconductor chip 10, etc. Method 250 begins at block 252 and continues with forming a buried insulator 104 upon a substrate 102 (block 254). For example, the buried insulator 104 may be deposited directly upon the substrate 102.

Method 250 may continue with forming an SOI layer 106 upon the buried insulator 104 (block 256). For example, the SOI layer 106 may be deposited directly upon the buried insulator 104.

Method 250 may continue with forming mask 108 upon the SOI layer 106 (block 258). For example, a hard mask 108 or soft mask 108 may be deposited upon the SOI layer 106.

Method 250 may continue with forming a deep trench 110 extending through mask 108, through SOI layer 106, through buried insulator 104, and extending partially through substrate 102 (block 260). Method 250 may continue with forming a dual reinforcement trenches 112 extending through mask 108, through SOI layer 106, through buried insulator 104, and extending partially through substrate 102 (block 262). In certain embodiments, block 260 and block 262 may be formed simultaneously. The trenches may be formed by opening the mask 108 by e.g., photoligraphy techniques. The opened portions of the mask 108 define areas of semiconductor structure 100 where a deep trench 110 and areas where dual reinforcing trenches 112 shall be formed. An enchant may then remove portions of SOI layer 106, buried insulator 104, and substrate 102 underlying the opened mask 108. Exposure to the enchant may be timed such that only portions of substrate 102 are removed to form deep trench 110 and dual reinforcing trenches 112 that do not extend through the substrate 102. In embodiments, the width and depth of each of the dual reinforcing trenches 112 are greater than the width and depth of the deep trench 110.

Method 250 may continue with filling the deep trench 110 forming filled deep trench 110' and partially filling each of the dual reinforcing trenches 112 (block 264). For example, trench material 120 may be deposited within the deep trench 110 filling the deep trench 110 and may be deposited upon the inner walls (e.g., sidewall(s) and bottom wall of dual reinforcing trenches 112, etc.) of the of each of the dual reinforcing trenches 112.

Method 250 may continue with subsequently filling each of the dual reinforcing trenches 112 forming filled dual reinforcing trenches 112' (block 266). For example, reinforcing material 122 may be deposited within each of the remaining dual reinforcing trenches 112 filling each of the remaining dual reinforcing trenches 112. The reinforcing material 122 and may be deposited upon the inner walls (e.g., sidewall(s) and/or bottom wall of each of the remaining dual reinforcing trenches 112, etc.) of each of the remaining dual reinforcing trenches 112. The filled dual reinforcing trenches 112' reduce curvature of the semiconductor structure 100 by stiffening the semiconductor structure 100. For example, the filled dual reinforcing trenches 112' resist tensile, compressive, and/or twisting forces upon or within the semiconductor structure 100 to limit curvature thereof.

Method 250 may continue with planarizing the filled deep trench 110' and the filled dual reinforcing trenches 112' with the top surface of the SOI layer 106 (block 268). For example, a CMP technique may be applied to semiconductor structure may to remove portions of the mask 108, the filled deep trench 110', and the filled dual reinforcing trenches 112' such that the top surface of the filled deep trench 110' and the filled dual reinforcing trenches 112' are coplanar with the top surface of the SOI layer 106.

Method 250 may continue with forming at least one fin by removing portions of the SOI layer 106 exposing portions of the buried insulator 104 (block 270). The fin may be formed by selectively etching portions of the SOI layer 106 by similar subtractive etching techniques as described herein.

Method 250 may continue with forming a gate upon the exposed buried insulator 104 and upon the fin covering the fin (block 272). The gate may be a dummy gate and formed with gate last fabrication techniques or the gate may be a functional gate formed by gate first fabrication techniques. The portions of the fin extending outwardly from the gate form the source and drain, respectively, of a FinFET microdevice. The portion of the fin covered by the gate form the channel of the FinFET microdevice.

Method 250 may continue with forming an ILD 150 upon exposed upper surfaces of the semiconductor structure 100 to a thickness sufficient to cover the gate (block 274). For example, the ILD 150 may be deposited upon exposed portions of buried insulator 104, upon the fin, and upon the gate, etc.

Method 250 may continue with forming a contact within the ILD 150 at least associated with the gate (block 276). For example, a mask may be applied upon the ILD 150. The ILD 150 may be patterned or opened to define areas of the ILD 150 where which one or more contacts 140 are located. An electrically conductive material may be deposited or otherwise formed within the openings of the ILD 150 to form contact 140. The contact 140 is associated with the gate. For example, the contact 140 may be electrically connected with and contacting the source or drain of the FinFET microdevice within a FET region 134 of structure 100. In certain embodiments, one or more contacts 142 are simultaneously formed. Contact(s) 142 electrically connect to one or more of the filled dual reinforcing trenches forming a MIM capacitor. Method 250 ends at block 278.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless otherwise indicated herein, "deposition," "deposit", or the like may include any now known or later developed techniques appropriate for the associated material to be deposited, including, but not limited to: CVD, LPCVD, PECVD, SACVD, HDPCVD, RTCVD, UHVCVD, LRP-CVD, MOCVD, thermal oxidation, thermal nitridation, PVD, ALD, chemical oxidation, MBE, sputtering, springing, plating, or the like.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of a wafer substrate, regardless of the actual spatial orientation of the substrate 102. The term "vertical" refers to a direction perpendicular to the horizontal, as just defined. Terms, such as "on", "above", "below", "side" (as in "sidewall"), "higher", "lower", "upper", "over", "beneath" and "under", are defined with respect to the horizontal plane. It is understood that various other frames of reference may be employed for describing the present invention without departing from the spirit and scope of the present invention.

What is claimed is:

1. A wafer comprising:
   a silicon on insulator (SOI) layer formed directly upon a buried insulating layer, the buried insulating layer formed directly upon a substrate;
   a filled deep trench associated with a microdevice within the wafer, wherein the filled deep trench is filled with a first filler comprised of a trench material, the first filler comprising an upper surface coplanar with the SOI layer upper surface;
   filled dual reinforcement trenches separated by dielectric material within the wafer, each filled dual reinforcement trench comprising:
      a liner comprised of the trench material directly upon one or more sidewalls of each of the dual reinforcement trenches and directly upon one or more lower surfaces of each of the dual reinforcement trenches, the liner comprising an upper surface coplanar with the SOI upper surface; and
      a second filler comprised of a reinforcing material directly upon the trench material, the second filler comprising an upper surface coplanar with the SOI upper surface;
   wherein the deep trench and filled dual reinforcing trenches extend through the SOI layer, through the buried insulating layer, and partially through the substrate;
   a first conductive contact directly upon at least the first filler; and
   a second conductive contact directly upon at least the liner of one of the dual reinforcing trenches.

2. The wafer of claim 1, wherein the reinforcing material has a material strength measurement greater than the trench material.

3. The wafer of claim 1, wherein each dual reinforcement trench width is greater than the deep trench width.

4. The wafer of claim 1, wherein each dual reinforcement trench depth is greater than the deep trench depth.

5. The wafer of claim 1, wherein the filled dual reinforcement trenches are included in a global reinforcement trench array throughout the wafer.

6. The wafer of claim 1, wherein the filled dual reinforcement trenches are included in a perimeter region at the edge of the wafer.

7. The wafer of claim 1, wherein the filled dual reinforcement trenches are included the wafer kerf.

* * * * *